United States Patent [19]

Fett

[11] 4,070,657
[45] Jan. 24, 1978

[54] CURRENT MODE SIMULTANEOUS DUAL-READ/SINGLE-WRITE MEMORY DEVICE

[75] Inventor: Darrell LeRoy Fett, Scottsdale, Ariz.

[73] Assignee: Honeywell Information Systems Inc., Phoenix, Ariz.

[21] Appl. No.: 756,466

[22] Filed: Jan. 3, 1977

[51] Int. Cl.² ............................................. G11C 11/40
[52] U.S. Cl. ..................................... 365/233; 365/49; 365/179
[58] Field of Search ......... 340/173 R, 173 AM, 172.5

[56] References Cited

U.S. PATENT DOCUMENTS 3,895,360  7/1975  Cricchi ......................... 340/173 AM Primary Examiner—Terrell W. Fears
Attorney, Agent, or Firm—William W. Holloway, Jr.; Ronald T. Reiling; Nicholas Prasinos

[57] ABSTRACT

A current mode 20-bit memory is organized as four words each containing five bits. The memory comprises a clock circuit a data-in circuit, comprising a plurality of data selectors and master latch registers, a data-out circuit comprising two independent sets of output buffers, two independent read select circuits, a write select circuit, a 4x5 matrix of memory cells, and non-functional testing circuit. In one mode data may be independently read from any two words at the same time that data is written into any one word. In another mode, all bits in a selected word may be synchronously reset. In a third mode the storage elements associated with one selected word may be configured as an inverting shift register for testing and diagnostic purposes. The device is implemented in current mode logic, and a portion of the circuitry operates on differential level signals for increased operational speed and efficiency.

4 Claims, 29 Drawing Figures

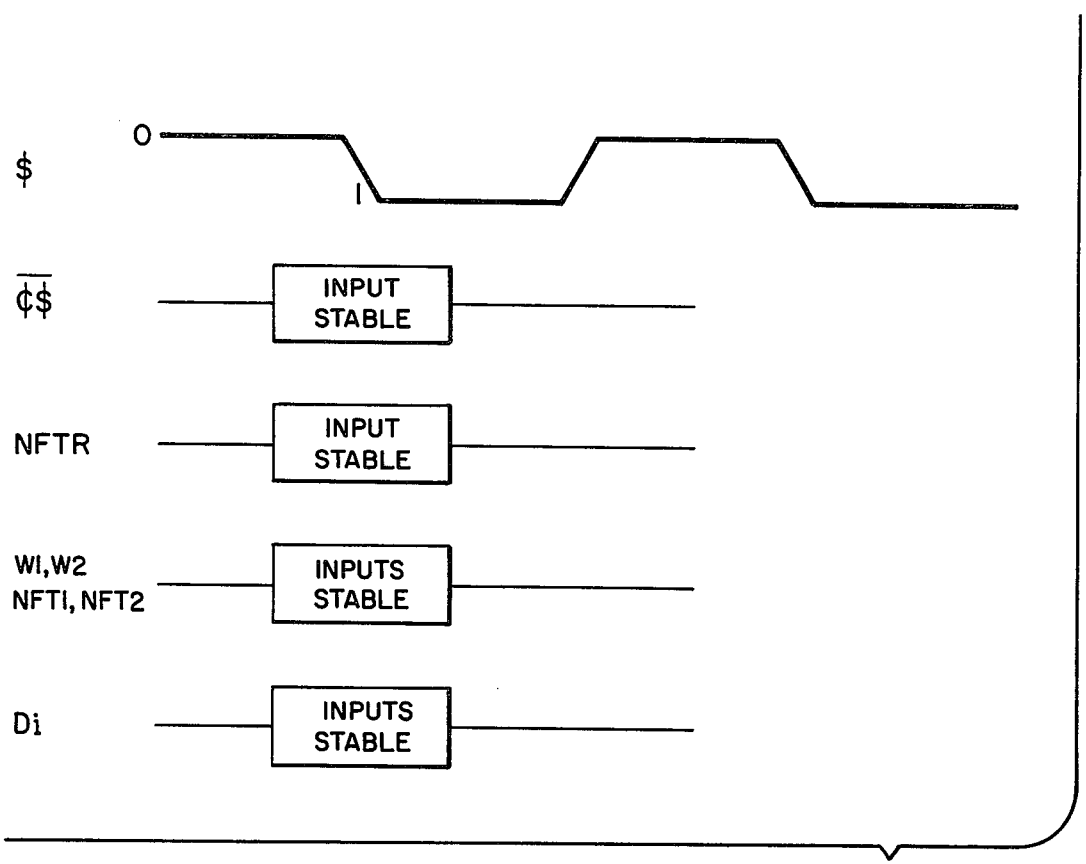
*Fig. 15*
*Fig. 16*
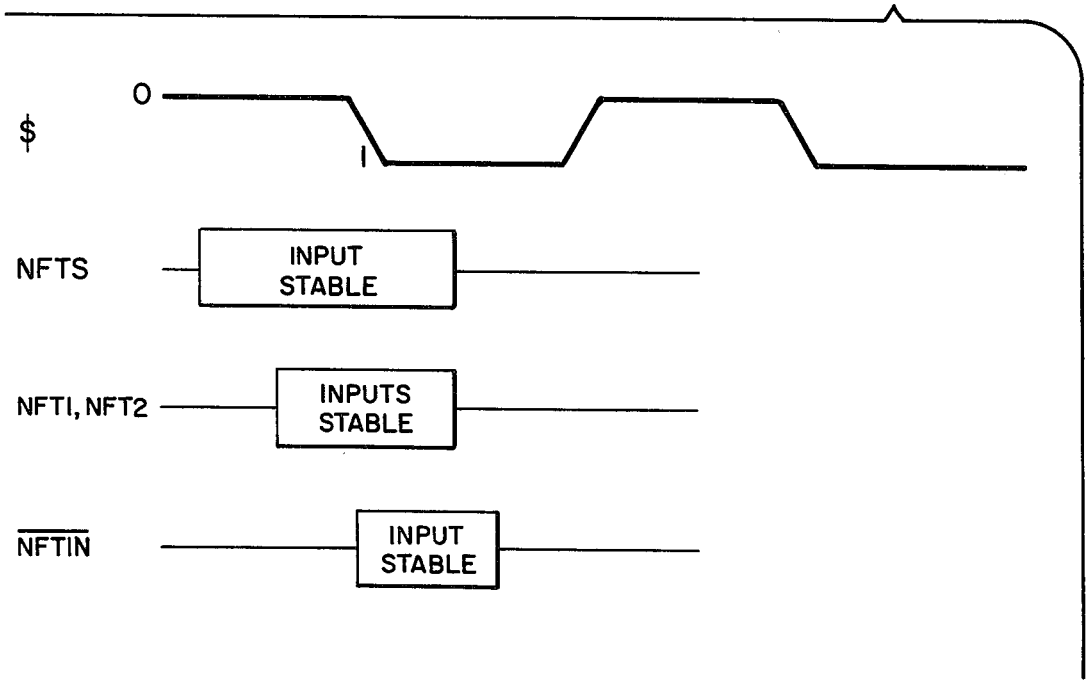

CURRENT MODE SIMULTANEOUS DUAL-READ/SINGLE-WRITE MEMORY DEVICE

CROSS-REFERENCE TO RELATED INVENTIONS

1. Current Mode Carry Look Ahead Array invented by Homer W. Miller, now issued as U.S. Pat. No. 3,925,652 and assigned to the same assignee as the instant invention.
2. Magnitude Comparison Circuit invented by Homer W. Miller, now issued as U.S. Pat. No. 3,955,177 and assigned to the same assignee as the instant invention.
3. Current Mode Arithmetic Logic Array invented by Homer W. Miller, now issued as U.S. Pat. No. 3,925,651 and assigned to the same assignee as the instant invention.
4. Current Mode Binary (BCD) Arithmetic Array invented by Homer W. Miller, now issued as U.S. Pat. No. 3,958,112 and assigned to the same assignee as the instant invention.
5. Data Alignment Circuit invented by Darrell L. Fett, now issued as U.S. Pat. No. 3,967,101 and assigned to the same assignee as the instant invention.
6. Selector Latch Gate invented by Darrell L. Fett, now issued as U.S. Pat. No. 3,953,746 and assigned to the same assignee as the instant invention.
7. N-Bit Register System Using CML Circuits invented by Darrell L. Fett, now issued as U.S. Pat. No. 3,984,702 and assigned to the same assignee as the instant invention.
8. High-Speed Random Access Memory invented by Darrell L. Fett, now issued as U.S. Pat. No. 3,916,394 and assigned to the same assignee as the instant invention.
9. Multiple-Generating Register invented by Darrell L. Fett, now issued as U.S. Pat. No. 3,949,209 and assigned to the same assignee as the instant invention.
10. Multiple-Generating Register invented by Jerome L. Kindell, bearing Ser. No. 642,845, filed Dec. 22, 1975, and assigned to the same assignee as the instant invention.
11. Current Mode Arithmetic Logic Circuit With Parity Prediction and Checking invented by Homer W. Miller bearing Ser. No. 756,457, filed Jan. 3, 1977, and assigned to the same assignee as the instant invention.
12. Current Mode 5-Bit Arithmetic Logic Unit With Parity invented by Homer W. Miller bearing Ser. No. 756,456, filed Jan. 3, 1977, and assigned to the same assignee as the instant invention.
13. Current Mode Multiple-Generating Register invented by Homer W. Miller bearing Ser. No. 756,465, filed Jan. 3, 1977, and assigned to the same assignee as the instant invention.
14. Current Mode 4-Bit Arithmetic Logic Unit With Parity invented by Homer W. Miller bearing Ser. No. 756,458, filed Jan. 3, 1977, and assigned to the same assignee as the instant invention.
15. Current Mode Binary/Decimal Arithmetic Logic Unit With Parity invented by Homer W. Miller bearing Ser. No. 756,460, filed Jan. 3, 1977, and assigned to the same assignee as the instant invention.
16. 5-Bit 1-of-4 Gated Select Circuit Utilizing Current Mode Logic invented by Homer W. Miller bearing Ser. No. 756,464, filed Jan. 3, 1977, and assigned to the same assignee as the instant invention.
17. 17-Bit Equality Comparator Utilizing Current Mode Logic invented by Homer W. Miller bearing Ser. No. 756,459, filed Jan. 3, 1977, and assigned to the same assignee as the instant invention.
18. J-K Flip-Flop Utilizing Current Mode Logic With Non-Functional Test Capability invented by Homer W. Miller bearing Ser. No. 756,461, filed Jan. 3, 1977, and assigned to the same assignee as the instant invention.
19. 4-Bit Counter/Shift Register Utilizing Current Mode Logic invented by Homer W. Miller bearing Ser. No. 756,463, filed Jan. 3, 1977, and assigned to the same assignee as the instant invention.
20. 10-Bit D-Type Register Utilizing Current Mode Logic invented by Homer W. Miller bearing Ser. No. 756,462, filed Jan. 3, 1977, and assigned to the same assignee as the instant invention.

BACKGROUND OF THE INVENTION

The invention relates generally to a digital memory device and, in particular, to a current mode simultaneous dual-read/single-write memory device. In the data processing industry there is a definite trend towards utilizing digital circuitry which is small in size and fast in operation. In order to achieve extremely fast operational capability, it is necessary to shorten the circuit paths between the various circuit elements as much as possible and to seek improved operational modes for the circuit elements which permit high-speed, efficient operation. With respect to increasing the operational speed of digital circuitry, it is desirable to have a circuit design which lends itself well to implementation in a high density semiconductor technology. However, as the density of circuitry increases, it becomes imperative that the power consumption of such circuitry be carefully controlled in order that the operational characteristics of the circuitry not be distorted or otherwise inhibited by the generation of excessive heat. With regard to the search for operational modes which permit high-speed operation, the use of current mode logic (CML) has been found to provide a relatively high operational speed. Examples of digital circuits implemented in CML technology may be found in some of the Related Inventions cited above.

Within the architecture of large data processing systems various data storage elements are required. Among the required storage elements are high-speed data storage registers, which registers are utilized for a wide variety of purposes. There is a need for fast, efficient, and reliable data storage registers, which need the present invention serves to fulfill, as will be seen below.

SUMMARY OF THE INVENTION

It is, therefore, an object of the present invention to provide an improved data storage register.

It is also an object of the present invention to provide a data storage register which has a relatively high operational speed and a relatively low power consumption.

It is yet another object of the present invention to provide an improved data storage register which is organized as $m$ words of $n$ bits each and in which data may be independently read from any two words at the same time that data is written into any single word.

It is still another object of the present invention to provide an improved data storage register which can be configured as an inverting shift register for test and diagnostic purposes.

These and other objects of the invention are achieved in accordance with a preferred embodiment of the invention by providing a current mode simultaneous dual-read/single-write memory comprising a clock circuit, a data-in circuit comprising a plurality of data selectors and master registers, a data-out circuit comprising two independent sets of output buffers, two independent read select circuits, a write select circuit, a 4×5 matrix of memory cells, and a non-functional testing circuit. In a "write" mode, the data present at the data-in circuit is written into the particular word selected by the write select circuit. Simultaneously, if desired, the contents of two words selected by the independent read select circuits may be transferred to the two independent sets of output buffers. In a reset mode, any single word may be set to logic zero. In a non-functional testing mode, the data storage cells of any single word may be configured as a 5-bit inverting shift register, and the internal operation of the memory device may be analyzed. The memory device utilizes current mode logic, and a subset of the current mode logic circuitry is implemented in differential level logic to increase operational speed and to decrease power consumption.

BRIEF DESCRIPTION OF THE DRAWINGS

The invention is pointed out with particularity in the appended claims. However, other features of the invention will become more apparent and the invention will be best understood by referring to the following detailed description in conjunction with the accompanying drawings in which:

FIGS. 2a–13a show various logic symbols appearing in FIGS. 1A and 1B;

FIGS. 2b–13b show detailed circuit schematics for performing the logic functions represented by the logic symbols in FIGS. 2a–13a;

FIGS. 15 and 16 are timing diagrams illustrating the timing relationships between certain of the signals within the present invention.

DETAILED DESCRIPTION OF THE INVENTION

Figure 1A:
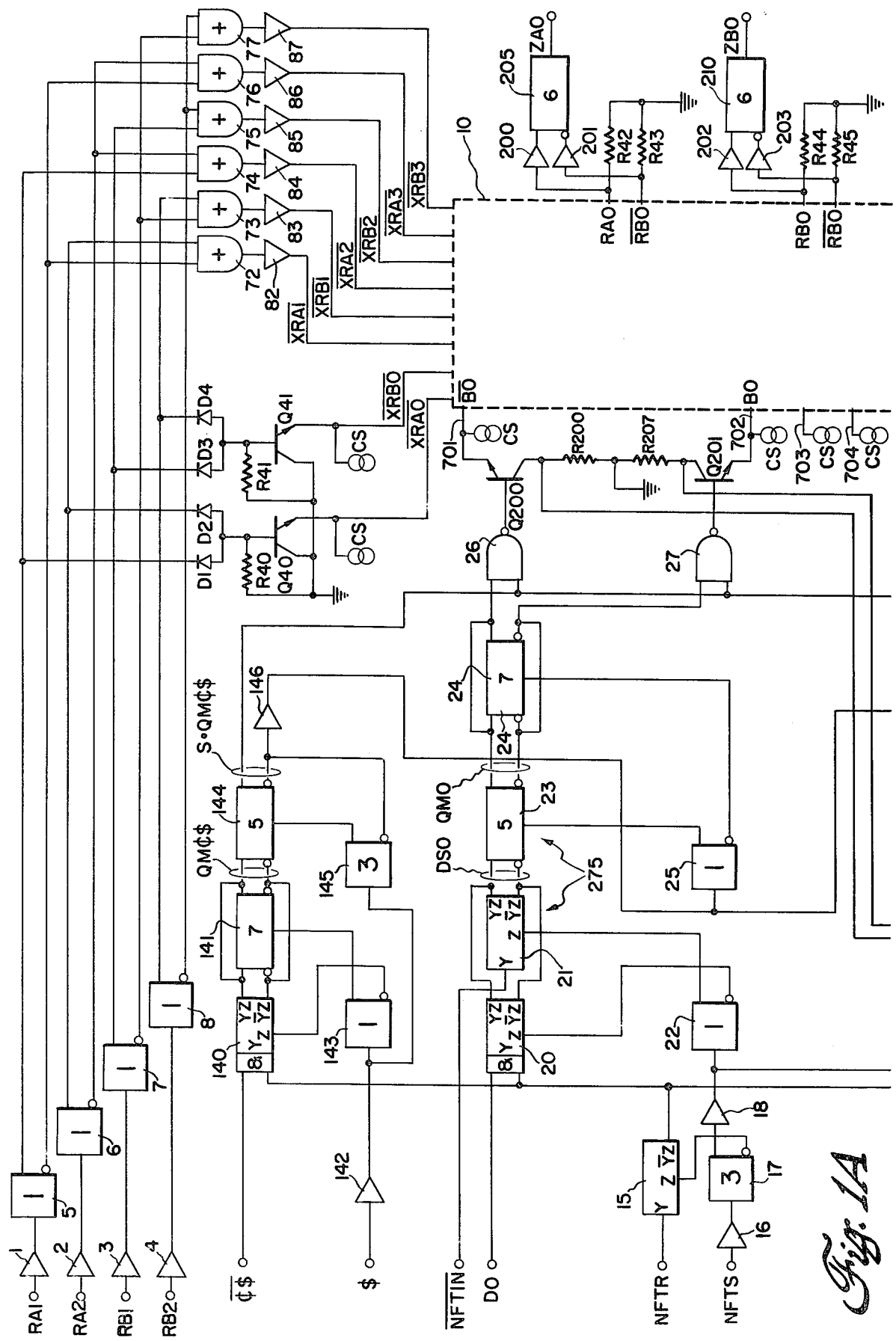
FIGS. 1A and 1B show a combination block/circuit diagram illustrating a preferred embodiment of the current mode simultaneous dual-read/single-write memory deivce of the present invention.
Figure 1B:
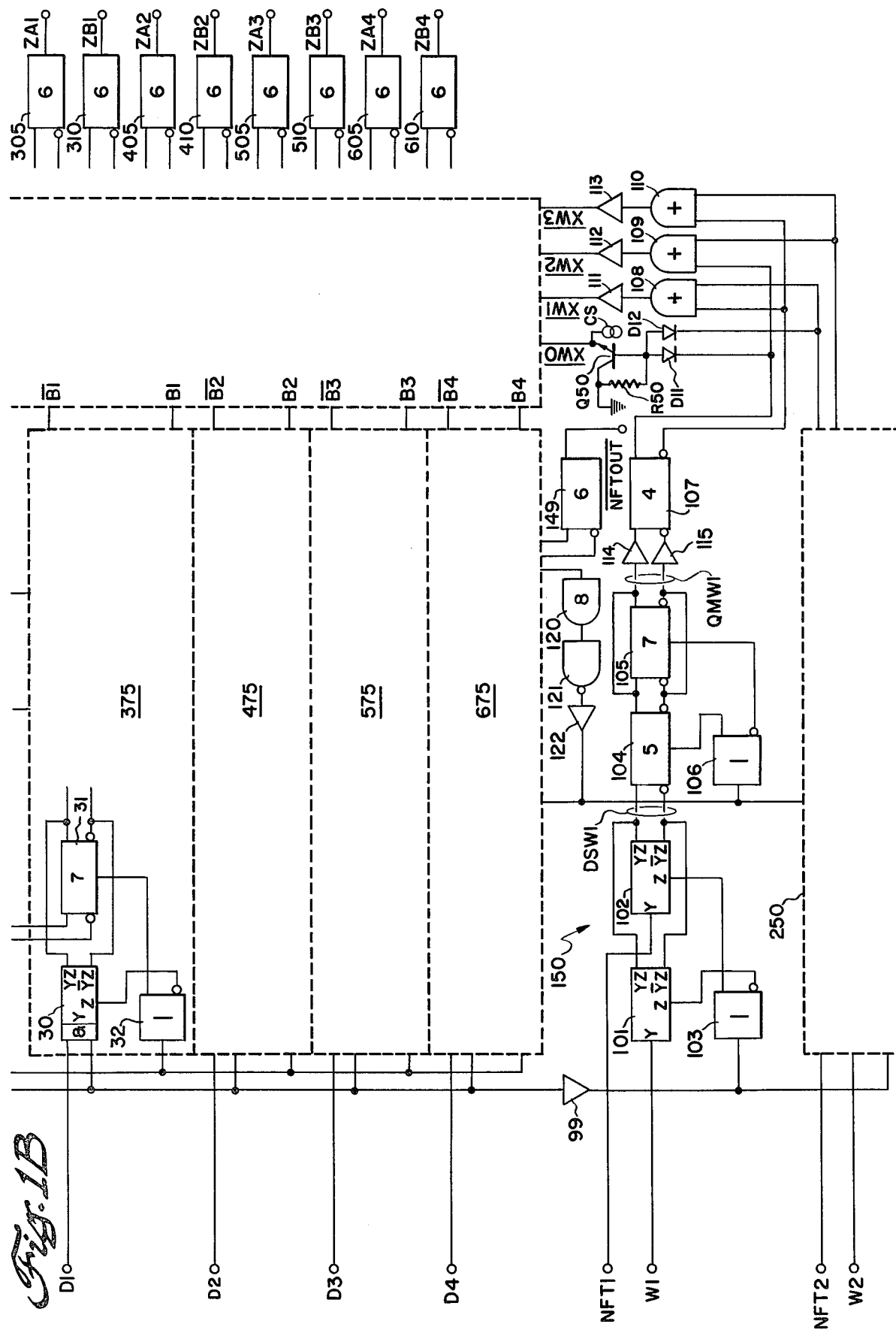
Figure 2A:
Figure 2B:
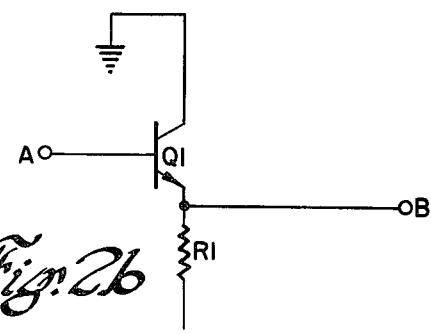

Referring now to FIGS. 1A and 1B, a combination block/circuit diagram of the current mode simultaneous dual-read/single-write memory device is shown. The memory device comprises a 4×5 matrix 10 of memory cells as well as the necessary input and control circuitry for writing data into and reading data from the memory matrix 10. Non-functional testing circuitry is also provided and will be described in detail below.

Before proceeding with a further discussion of the detailed operation of the present invention, it will be appropriate at this point to discuss the structure and operation of the individual circuit components illustrated in FIGS. 2-13. FIG. 2a is the symbol for an emitter follower having an input A and an output B. This is used in the present invention primarily as a voltage translator, shifting the voltage applied at input A down by 0.8V at the output B. FIG. 2b shows the equivalent electrical circuit, wherein input A is applied to the base of transistor Q1, and output B is taken at the common terminal of resistor R1 and the emitter of transistor Q1.

Figure 3A:
Figure 3B:
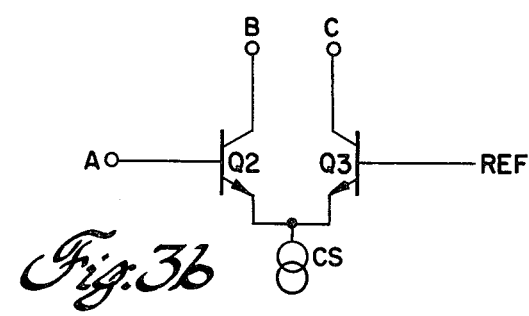
Figure 4A:
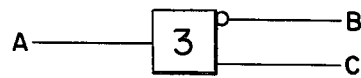
Figure 4B:
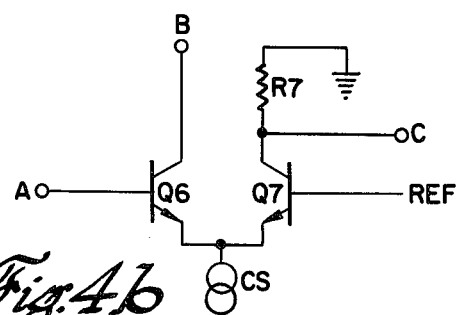

FIGS. 3a and 4a illustrate the symbol for a lower level gate, which gate may be implemented in either of the two ways illustrated in FIGS. 3b and 4b, depending upon whether the outputs of the lower level gate drive an upper level gate or not. The lower level gate has an input A, a true output C and a complement output B. In FIG. 3b the A input is applied to the base of transistor Q2, and a reference voltage of −0.26V is applied to the base of transistor Q3. The true or C output is taken from the collector terminal of transistor Q3, and the complement or B output is taken from the collector of transistor Q2. With NPN bipolar transistors a binary 0 at input A in the form of a 0V signal causes conduction in transistor Q2 and non-conduction in transistor Q3, so that a 0V signal, representing a binary 0, is generated over the C output, and a −0.5V signal, representing a binary 1 (assuming a negative logic convention), appears at the B output. Conversely, a binary 1 at input A renders transistor Q2 non-conductive and transistor Q3 conductive, thereby generating a binary 0 at output B and a binary 1 at output C. When either or both of the outputs B and C of the lower level gate are used to drive an upper level gate, such as that illustrated in FIGS. 6, 7, or 9, the resistor is eliminated from the corresponding leg of the output portion of the lower level gate. Thus, the circuit illustrated in FIG. 3b, whose outputs are both used to drive upper level gates, has no resistors in the output legs. Regarding the circuit shown in FIG. 4b, the B output drives an upper level gate, whereas the C output does not drive an upper level gate.

Figure 5A:
Figure 5B:
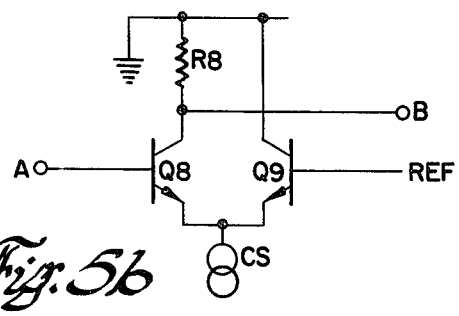

FIG. 5a shows the logic symbol for an inverter having an input A and an inverting output B. Referring to FIG. 5b, when a binary 1 in the form of a −0.5V appears on input A at the base of transistor Q8, Q8 is turned off, and a 0V signal representing a binary 0 appears at the output B. Conversely, when input A is a binary 0, Q8 turns on, and the voltage at output B is −0.5V representing a binary 1.

Figure 6A:
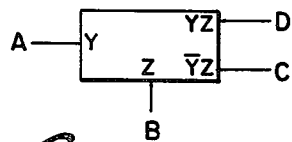
Figure 6B:
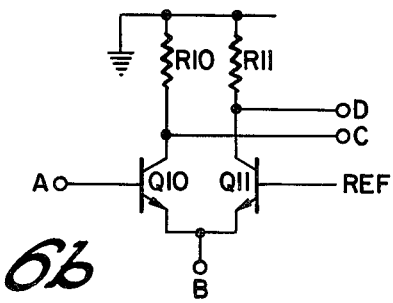

FIG. 6a shows the symbol for a 2-input upper level gate having inputs A and B applied to input terminals Y and Z, respectively, and producing Y.Z and $\overline{Y}$.Z outputs at output terminals D and C, respectively. In the equivalent electrical schematic of FIG. 6b input A is applied to the base of transistor Q10, and input B is applied to the common terminal of the emitters of transistors Q10 and Q11. A reference voltage of −0.26V is applied to the base of transistor Q11, and the collectors of transistors Q10 and Q11 are connected through resistors R10 and R11, respectively, to ground. The C output is taken at the collector of transistor Q10, and the D output is taken at the collector of transistor Q11. The upper level gate shown in FIG. 6 is modified slightly when its outputs feed a differential upper level gate, such as that shown in FIG. 9. In this case, the values of resistors R10 and R11 are cut in half in order that the output voltage representing a binary 1 be −0.25V instead of −0.5V.

Figure 7A:
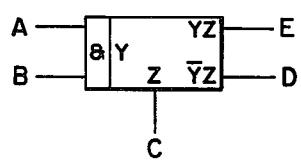
Figure 7B:
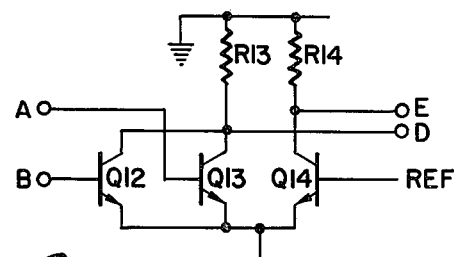

The upper level gate shown in FIG. 7a is similar in function to that shown in FIG. 6a, the Y input here being the AND function of inputs A and B and the Z input again being the C input. Thus, output E equals A.B.C and output D equals $\overline{A.B}$.C. With reference to the equivalent electrical schematic shown in FIG. 7b, the A and B inputs are applied to the bases of transistors Q13 and Q12, respectively, the C input is applied to the common terminal of the emitters of transistors Q12–Q14, the D output is taken at the common terminal of the collectors of transistors Q12 and Q13, and the E output is taken at the collector of transistor Q14. For current to flow through the E output, inputs A and B must both be a binary 1 in the form of a −0.5V signal, thus rendering transistor Q14 conductive and input C must be present. Otherwise, if either of the A or B inputs are a binary 0 (0V) and the C input is present, current will flow through output terminal D.

The upper level gates of FIGS. 7 and 8 are used in combination with the lower level gates shown in FIGS. 3 and 4. As described previously, the reference voltage for the upper level gates is −0.26V and the logic inputs are either 0V or −0.5V. The output voltage swings between 0 and −0.5V in the normal situation, but it swings between 0 and −0.25V when the lower level gate feeds a differential upper level gate such as that shown in FIG. 9. Since the inputs to the lower level gates are derived from emitter followers, the consequent 0.8V voltage translation necessitates a reference voltage of −1.06V for the lower level gates.

Figure 8A:
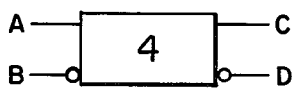
Figure 8B:
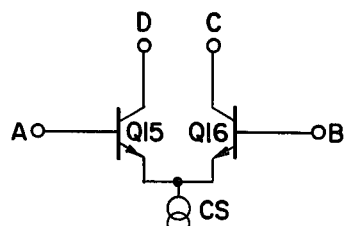

FIG. 8a shows the logic symbol for a differential lower level gate. The differential lower level gate receives as inputs signals A and B of opposite polarity and generates as outputs signals C and D, signal C being at the same level as input signal A, and signal D being at the same level as input B. FIG. 8b shows the circuit implementation of the differential lower level gate, wherein signal A is applied to the base of transistor Q15, and input signal B is applied to the base of transistor Q16. A current source (i.e., a resistor or transistor) is connected to the common terminal of the emitters of transistors Q15 and Q16. Output signal D is taken from the collector of transistor Q15, and output signal C is taken from the collector of transistor Q16.

Figure 9A:
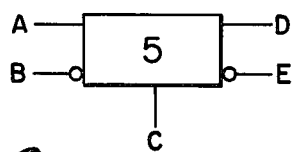
Figure 9B:
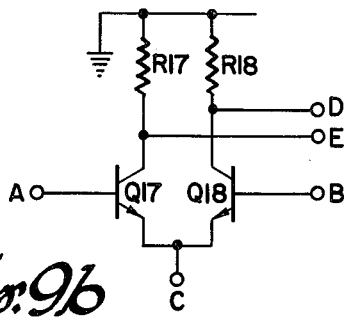

FIG. 9a illustrates the logic symbol for a differential upper level gate having inputs A and B of opposite polarity and an enabling input C. Output D is of the same polarity as input A, and output E has the polarity of input B. Referring to the equivalent schematic of FIG. 9b, input A supplied to the base of transistor Q17, input B is applied to the base of transistor Q18, input C is applied to the common terminal of the emitters of transistors Q17 and Q18, output D is taken from the junction of resistor R18 and the collector of transistor Q18, and output E is taken from the junction of resistor R17 and the collector of transistor Q17.

Figure 10A:
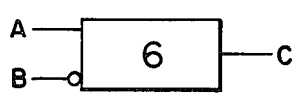
Figure 10B:
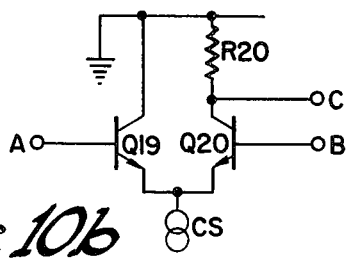

FIG. 10a shows a logic symbol for an output buffer having different inputs A B. The output buffer generates output C of the same polarity as input A. As the equivalent electrical schematic of FIG. 10b illustrates, input A is made to the base of transistor Q19, input B is made to the base of transistor Q20, current source CS is connected to the common terminal of the emitters of transistors Q19 and Q20, and output C is connected to the junction of resistor R20 and the collector of transistor Q20.

Figure 11A:
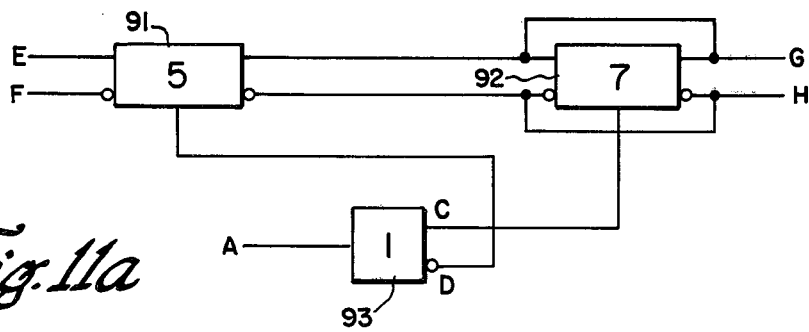
Figure 11B:
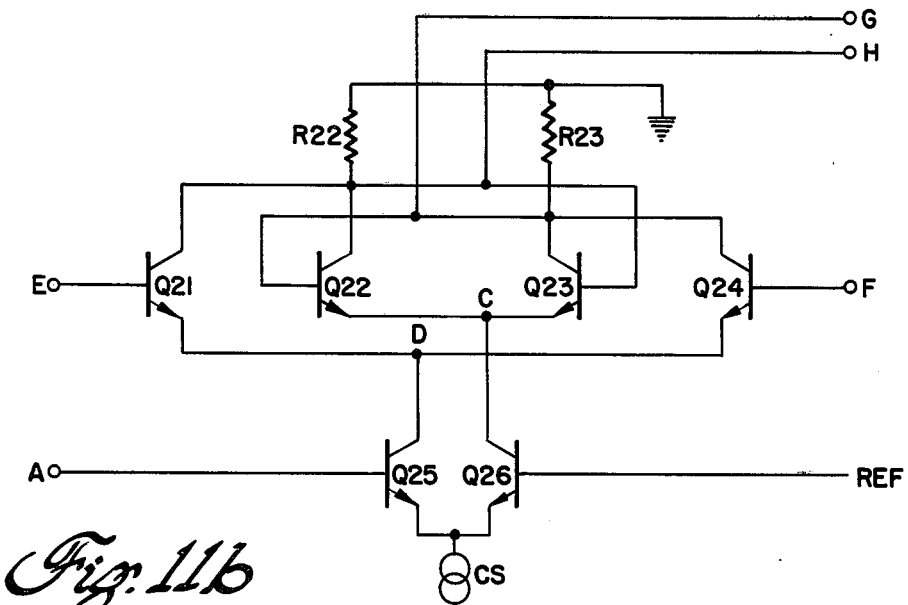

FIG. 11a shows a characteristic grouping of logic gates which appears once for each bit position, in the form of a master register. In this grouping a differential lower level gate 93 controls the operation of two differential upper level gates 91 and 92. The differential lower level gate 93 has an input A and true and complementary outputs C and D, respectively. The C output of differential lower level gate 93 enables the differential upper level gate 92, and the D output of differential lower level gate 93 enables differential upper level gate 91. Differential upper level gate 91 contains a pair of complementary inputs E and F and a pair of complementary outputs which in turn serve as the inputs to differential upper level gate 92. Differential upper level gate 92 has a complementary pair of outputs G and H, as well as a pair of feedback lines to its input terminals, which feedback lines serve as a latching mechanism. With reference to the equivalent electrical schematic shown in FIG. 11b, differential lower level gate 93 comprises transistors Q25 and Q26 and current source CS. Input A to differential lower level gate is applied to the base of Q25, while a reference voltage is applied to the base of transistor Q26. Differential upper level gate 91 comprises a pair of transistors Q21 and Q24 whose common emitter junction D is connected to the collector of transistor Q25, and a pair of resistors R22 and R23 connected between the collector terminals of Q21 and Q24, respectively, and ground. Differential upper level gate 92 comprises a pair of transistors Q22 and Q23 whose common emitter terminal C is connected to the collector of transistor Q26, and whose collector terminals are connected to ground through resistors R22 and R23, respectively. Input E to differential upper level gate 91 is applied to the base of transistor Q21, while input F is applied to the base of transistor Q24. The base of transistor Q22 is connected to the collector of transistor Q24, while the base of transistor Q23 is connected to the collector of transistor Q21. Output G of differential upper level gate 92 is taken from the junction of the collector of transistor Q23 and resistor R23, and output H is taken from the junction of the collector of transistor Q22 and resistor R22.

The operation of the combination of logic gates shown in FIG. 11a is as follows. When A=0 and B=1, then G=E and H=F. This can be shown to be true by the following analysis. When a binary 0 in the form of a 0V signal is applied to the base of transistor Q25, Q25 is conductive, and Q26 is non-conductive by virtue of the complementary −0.25V signal applied to its base. If a binary 1 signal, represented by a −0.25V signal is applied to the base of transistor Q21, and the complementary logic 0 signal is applied to the base of transistor Q24, transistor Q21 is non-conductive and transistor Q24 is conductive. With transistors Q24 and Q25 turned on, a conductive path is formed from the current source CS across the emitter-to-collector junction of Q25 and Q24, across R23 to ground. The potential at the G output is correspondingly −0.25V representing a binary 1. Because transistor Q21 is off, the potential at the H output remains at 0V corresponding to a binary 0. When A and B inputs switch so that A=1 and B=0, transistor Q25 turns off and transistor Q26 turns on. For these values of A and B, the G and H outputs of a differential upper level gate 92 remain latched irrespective of the values of E and F into differential upper level gate 91 as the following analysis will show. Assuming that E=1 and F=0 prior to the time when the values of A and B became logical 1 and 0, respectively, the −0.25V potential on the G line is momentarily applied to the base of transistor Q22, keeping such transistor turned off. The 0V potential previously existing at the base of transistor Q23 keeps such transistor turned on. Thus, a current path is formed between current source CS across the emitter-to-collector junctions of transistors Q26 and Q23 through resistor R23 to ground. Since transistor Q25 remains non-conductive, the values of the E and F inputs to differential upper level gate 91 may change without affecting the G and H outputs of differential upper level gate 92.

Figure 12A:
Figure 12B:
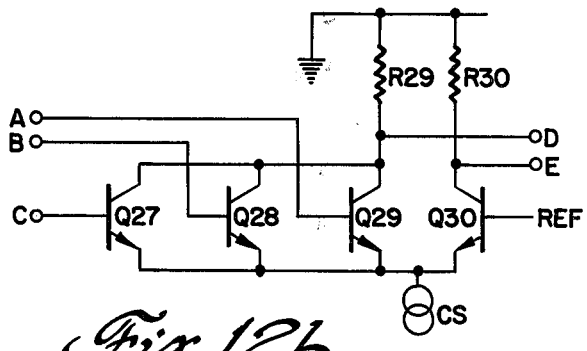

FIG. 12a shows the logic symbol for a three-input NAND gate having a true output E and a complementary output D. The true output E of the NAND gate is a logical 1 whenever any of the inputs is a logical 0, and the true output E becomes a logical 0 only when all three inputs are logical 1's. The equivalent electrical circuit is shown in FIG. 12b wherein the emitter outputs of transistors Q27-Q30 are all tied to current source CS, the collector junctions of transistors Q27-Q29 are connected to ground through resistors R29, and the collector junction of transistor Q30 is connected to ground through resistor R30. The C, B, and A inputs are connected to the bases of transistors Q27, Q28 and Q29, respectively. The D output is tied to the common junction of the collector of transistor Q29 and resistor R29. The E output is connected to the common junction of the collector of transistor Q30 and resistor R30.

Figure 13A:
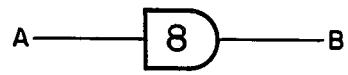
Figure 13B:
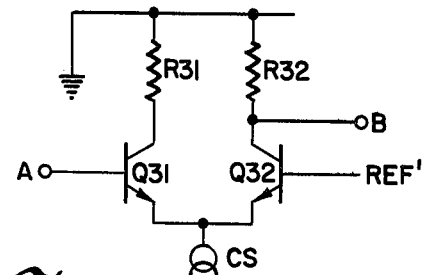

FIG. 13a illustrates the symbol for the voltage translator used in the pulse-stretching circuit comprising circuit elements 120-122 in FIG. 1B. FIG. 13b illustrates the equivalent electrical circuit, wherein input A is applied to the base of transistor Q31, and output B is taken at the common terminal of resistor R32 and the collector of transistor Q32. The reference voltage REF' applied to the base of transistor Q32 differs from the normal reference voltage REF.

With these basic functional circuit elements in mind, defined by the logic symbols illustrated in FIGS. 2a-13a and the equivalent electrical schematics illustrated in FIGS. 2b-13b, we will now consider the overall architecture of the improved current mode simultaneous dual-read/single-write memory device of the present invention as illustrated in FIGS. 1A and 1B.

The clock circuit is responsive to a clock signal $ and a clock enable signal $\overline{c\$}$. The clock signal $ is applied to lower level gate 143 through emitter follower 142. The clock enable signal $\overline{c\$}$ is applied to differential upper level gate 140. The YZ and $\overline{YZ}$ outputs of differential upper level gate 140 serve as the true and complement inputs to feedback differential upper level gate 141. When the true output of lower level gate 143 is a logical 1 feedback differential upper level gate 141 generates output signals QMc$ identical to the outputs of differential upper level gate 140. When the true output of lower level gate 143 is a logical 0 the outputs QMc$ of feedback differential upper level gate 141 remain latched irregardless of the particular outputs of differential upper level gate 140.

When the true output of lower level gate 145 is a logical 1, differential upper level gate 144 generates an output signal $.QMc$ equal to the output QMc$ of feedback differential upper level gate 141. When the true output of lower level gate 145 is a logical 0, differential upper level gate 144 generates zero-valued outputs at both its output terminals. The true output of differential upper level gate 144 is transmitted over line 147 and applied as one input to NAND gates 26 and 27, to similarly situated pairs of NAND gates within the data selector circuits 375, 475, 575, and 675, and to voltage translating circuit 120, which is part of a pulse-stretching circuit comprising voltage translator circuit 120, inverter 121, and emitter follower 122. The complement output of differential upper level gate 144 is OR'd with the complement output of lower level gate 145 and transmitted through emitter follower 146 to lower level gate 25, to similarly situated lower level gates in data selector circuits 375, 475, 575, and 675, to lower level gate 106 of write select circuit 150, and to a similarly situated lower level gate of write select circuit 250.

Data-in circuit 275 receives either a binary 0 or binary 1 over data input terminal D0 and generates a pair of complementary output signals $\overline{B0}$ and B0 to memory matrix 10. Data-in circuit 275 also receives as an input an $\overline{NFTIN}$ input. Data-in circuits 375, 475, 575, and 675 are of substantially identical construction to that of data-in circuit 275, with the exception that the later data-in circuits do not receive the $\overline{NFTIN}$ input signal but rather an NFT output single from the previous data-in circuit. The NFT output of data-in circuit 675 is transmitted to upper level gate 149, which generates an $\overline{NFTOUT}$ signal.

The D0 input to data-in circuit 275 is applied as one input to upper level gate 20. A non-functional test reset signal NFTR is applied to the other input of upper level gate 20 by way of upper level gate 15, which gate is enabled by the complement output of lower level gate 17. The NFTR signal is also applied to corresponding upper level gates in each of data-in circuits 375, 475, 575, and 675, and it is transmitted through emitter follower 99 to lower level gates 103 in write select circuit 150 and to a corresponding lower level gate (not shown) in write select circuits 250. The NFTS input signal is transmistted through emitter follower 16, lower level gate 17, and emitter follower 18 to lower level gate 22 of data-in circuit 275 and to corresponding lower level gates (not shown) of data-in circuits 375, 475, 575, and 675.

The $\overline{NFTIN}$ signal is applied to the Y input of upper level gate 21. Upper level gate 20 is enabled by the complemented output of lower level gate 22, and upper level gate 21 is enabled by the true output of lower level gate 22. The $\overline{YZ}$ output of upper level gate 20 is connected to the $\overline{YZ}$ output of upper level gate 21 and applied to the true input of differential upper level gate 23. The YZ output of upper level gate 20 is connected to the YZ output of upper level gate 21 and is transmitted to the complement input of differential upper level gate 23. Upper level gates 20 and 21 function as data selector circuitry within the data-in circuit 275. Differential upper level gate 23 and 24 function as a master data register within data-in circuit 275. Differential upper level gate 23 is enabled by the true output of lower level gate 25, and differential upper level gate 24 is enabled by the complement of lower level gate 25. The true output of differential upper level gate 23 is applied to the true input of feedback differential of upper level gate 24, and the complement output of differential upper level gate 23 is applied to the complement input of feedback differential of upper level gate 24. The true output of feedback differential upper level gate 24 is applied as the other input to NAND gate 26, and the complement output of feedback differential upper level gate 24 is applied as the other input to NAND gate 27. The output of NAND gate 26 is applied to the base of NPN transistor Q200, and the output of NAND gate 27 is applied to the base of NPN transistor Q201. Transistors Q200 and Q201, resistors R200 and R201, and current source CS function as driver circuitry. The $\overline{B0}$ data input signal to memory matrix 10 is taken off the emitter of transistor Q200, and the B0 data input to memory matrix 10 is taken off the emitter of transistor Q201.

There are two independent read select circuits for the present invention. A first read select circuit receives as inputs RA1 and RA2 read select signals. The particular combination of such signals indicates one of four possible words to be read from memory matrix 10. The other read select circuit receives as inputs the RB1 and RB2 read select signals, which signals indicate another of four possible words to be read from memory matrix 10.

The pair of RA1 and RA2 signals are input into inverting/non-inverting gates 5 and 6 through emitter followers 1 and 2, respectively, while read select signals RB1 and RB2 are input into inverting/non-inverting logic gates 7 and 8 through emitter followers 3 and 4, respectively. The true outputs of gates 5 and 6 are applied to the cathodes of diodes D1 and D2, respectively. The true outputs of logic gates 7 and 8 are applied to the cathodes of diodes D3 and D4, respectively. The anodes of diodes D1 and D2 are joined together, as are the anodes of diodes D3 and D4. Thus, the pair of diodes D1 and D2 forms an OR gate, as does the pair of diodes D3 and D4. Similar logic functions are shown symbolically in the form of OR gates 72-77.

The junction of the anodes of diodes D1 and D2 is connected directly to the base of transistor Q40 as well as to ground through resistor R40. The collector of Q40 is also tied to ground, and the emitter of Q40 is connected to a current source CS. The emitter follower circuit thereby formed is identical to that connected to the junction of the anodes of diodes D3 and D4, and such is shown schematically as emitter followers 82-87. Signal $\overline{XRA0}$ is the output taken from the emitter of transistor Q40, and signal $\overline{XRB0}$ is the output signal taken from the emitter of transistor Q41. The outputs from emitter followers 82 and 83 are $\overline{XRA1}$ and $\overline{XRB1}$ respectively. The outputs from emitter followers 84 and 85 are $\overline{XRA2}$ and $\overline{XRB2}$ respectively. The outputs from emitter followers 86 and 87 are $\overline{XRA3}$ and $\overline{XRB3}$ respectively. The read select outputs $\overline{XRA0}$, $\overline{XRB0}$, ..., $\overline{XRA3}$, $\overline{XRB3}$ are transmitted into memory cell matrix 10, where they enable selected bits to be read out from memory cell matrix 10, as will be explained in greater detail below.

Referring now to the lower portion of FIG. 1B, the write select circuitry will be explained. The operation of write select circuits 150 and 250 is substantially identical, and write select circuit 150 alone will be described in any detail. Write select signals W1 and W2 serve to select one of four possible word positions in memory cell matrix 10 to be written into. Depending upon the particular combination of W1 and W2 signals, a particular write select command signal $\overline{XW0}$-$\overline{XW3}$ is transmitted into memory cell matrix 10 to enable a particular column of memory cells representing one word to be written into. Write select signal W1 is applied to the Y terminal of upper level gate 101, and the complement output of lower level gate 103 is applied to the input of upper level gate 101. Two NFT write select signals NFT1 and NFT2 are also applied to the write select circuits 150 and 250, giving a combination of four possible words which can be selected for configuration as shift registers with inversion between each bit thereof. The NFT1 select signal is applied to the Y input of differential upper level gate 102, and the true output of lower level gate 103 is applied to the Z input of differential upper level gate 102. Upper level gates 101 and 102 of write select circuit 150 serve a data selector function. Upper level gates 104 and 105 of write select circuit 150 serve as master registers. The true output of upper level gate 102 is applied to the true input of upper level gate 104, and the $\overline{YZ}$ output of upper level gate 102 is applied to the inverting input of differential upper level gate 104. The outputs of differential upper level gate 102 are designated as DSW1. The true output of lower level gate 106 is used to enable differential upper level gate 104, and the complement output of lower level gate 106 is used to enable feedback differential upper level gate 105. The true output of differential upper level gate 104 is applied to the true input of feedback differential upper level gate 105, and the complement output of differential upper level gate 104 is applied to the inverting input of feedback differential upper level gate 105. The true output of feedback differential upper level gate 105 is transmitted through emitter follower 114 to the true input of differential upper level gate 107, and the complement output of feedback differential upper level gate 105 is transmitted through emitter follower 115 to the inverting input of differential upper level gate 107. The outputs of feedback differential upper level gate 105 are designated as QMW1. The true output of differential upper level gate 107 is applied to the cathode of diode D11. Diodes D11 and D12 form an equivalent OR gate, and transistor Q50 and resistor R50 form an emitter follower circuit which is symbolized by emitter followers 111-113. The true output of differential upper level gate 107 is also applied as one input to OR gate 109. The complement output of gate 107 is applied as one input to each of OR gates 108 and 110.

Regarding write select circuit 250, the true output from the differential upper level gate corresponding to gate 107 of write select circuit 150 is applied to the cathode of diode D12 and to the other input of OR gate 108, while the complement output is applied to each of OR gates 108 and 110. The outputs of OR gates 108-110 are transmitted through emitter followers 111-113 in the form of write select command signals $\overline{XW1}$-$\overline{XW3}$. These signals are transmitted into memory cell matrix 10 to enable one of the following three operations to be performed on one of four possible words: (1) if neither NFTR nor NFTS are binary ones, the bits input into input terminals D0-D4 are transferred to the particular word selected by write select signals W1 and W2 when the clock signal $ goes low (i.e., to a logical one); (2) if NFTR is a logical one and NFTS is a logical zero, the particular word selected by the NFT1 and NFT2 write select signals is set to a logic 0 when the clock signal $ goes low; or (3) if NFTS is a logic 1, the particular word selected by the NFT1 and NFT2 write select signals is configured as a 5-bit shift register with inversion between each bit. Data is shifted one bit position for each falling edge of the clock signal $. The input to the first bit position is provided by $\overline{NFTIN}$ and the output from the last bit position appears at the $\overline{NFTOUT}$ signal at the true output of output buffer 149. It should be noted that in the non-functional testing mode (case 3 above) the memory device functions as a random access memory (RAM) wherein both the read and write addresses are supplied by the NFT1 and NFT2 write select signals. The significance of this is that the read and write operations are sequential for these conditions rather than simultaneous.

Two independent sets of data output buffers are provided and are shown at the right-hand portions of FIGS. 1A and 1B. One set of output buffers comprises buffers 205, 305, 405, 505, and 605, having outputs ZA0-AA4, respectively. The other set of buffers comprises buffers 210, 310, 410, 510, and 610, having outputs ZB0-ZB4, respectively. Each output buffer receives a pair of inputs from the memory cell matrix 10. For example, output buffer 205 receives as inputs thereto signals RA0 and $\overline{RA0}$ by way of emitter followers 200 and 201 respectively. Also, output buffer 210 receives as inputs RB0 and $\overline{RB0}$ through emitter followers 202 and 203 respectively.

Figure 14:
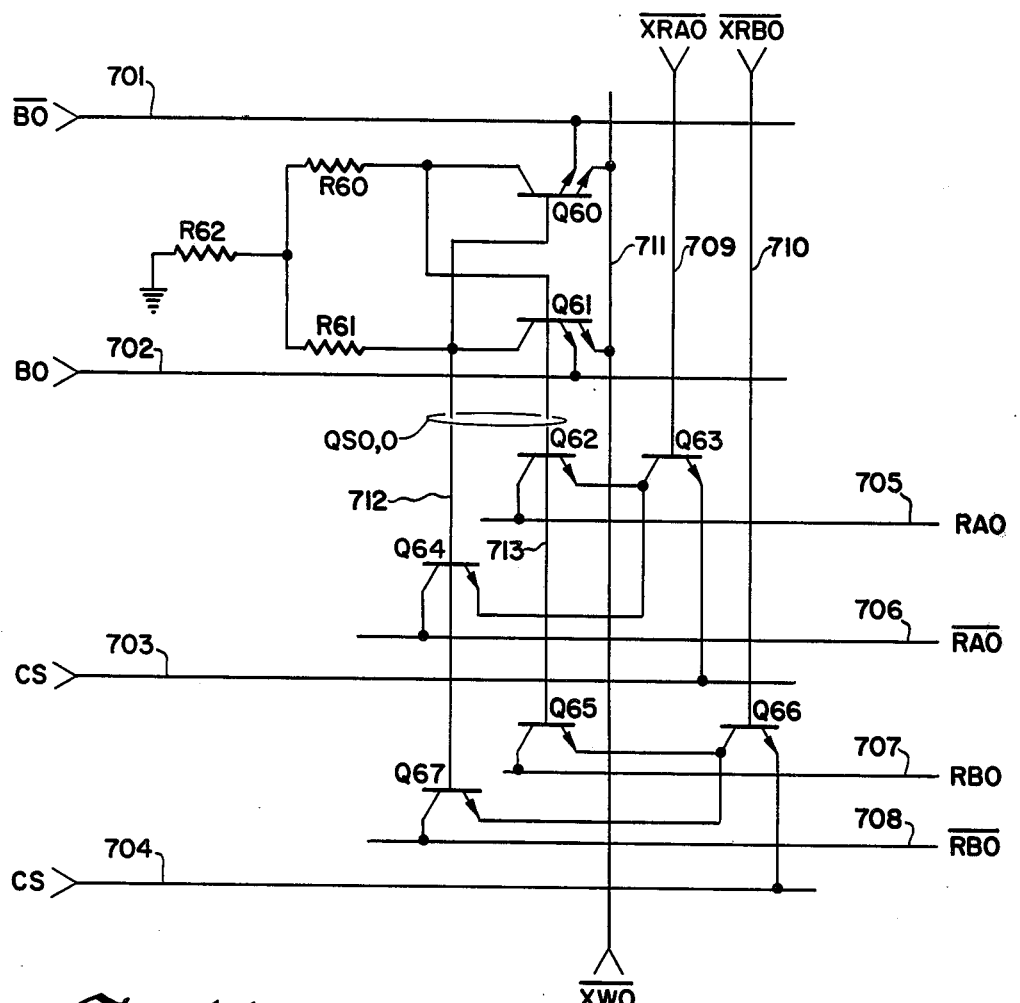
FIG. 14 shows a detailed circuit schematic illustrating a representative memory cell within the 4×5 matrix 10 of memory cells shown in FIGS. 1A and 1B.

FIG. 14 shows a detailed circuit schematic for a representative one of the memory cells in memory cell matrix 10, and in particular the uppermost cell in the left-most column of memory cell matrix 10. Each memory cell comprises a pair of NPN bipolar transistors Q60 and Q61. Transistors Q60 and Q61 are dual emitter transistors which are interconnected as a bistable flip-flop with the collector of transistor Q60 connected to the base of transistor Q61, and the collector of transistor Q61 connected to the base of transistor Q60. The collector of transistor Q60 is connected to ground through resistors R60 and R62, and the collector of transistor Q61 is also connected to ground through resistors R61 and R62. One emitter of each transistor Q60 and Q61 is connected to a line 711 over which a write select command signal $\overline{XW0}$ may be transmitted. The second emitter of transistor Q60 is connected to line 701 over which signal $\overline{B0}$ is transmitted, and the other emitter of transistor Q61 is connected to line 702 over which signal B0 is transmitted. Write select command signal $\overline{XW0}$ is transmitted over line 711 to corresponding emitters of other dual emitter transistors in the other four memory cells (not shown) comprising the left-hand most column of m×n memory cell matrix 10.

The base of transistor Q61 is connected to the bases of transistors Q62 and Q65 by line 713. The base of transistor Q60 is connected to the bases of transistors Q64 and Q67 by line 712. For NPN dual emitter transistors, the transistor whose emitter-to-collector potential is most negative is driven on, while the other transistor is driven off. Thus during a write operation involving the particular memory cells shown, the potential on one or the other of lines 701 and 702 will be less than the other, causing the transistor Q60 or Q61 associated with such line to be driven on. For example, if a binary one is written into a memory cell, (i.e., data-in signal D0 is a binary 1), the output of NAND gate 26 (refer to FIG. 1A) will be a 0 when signal $.QM¢$ is a 1. With the output of NAND gate 26 a 0, a 0V signal is applied to the base of transistor Q200 causing such to become conductive, and a conductive path is formed from current source CS across the emitter-to-collector junction of transistor Q200, through resistor R200 to ground. At the same time the output of NAND gate 27 is a 1, causing transistor Q201 to be non-conductive. Thus the potential on line 702 is more negative than that on line 701, causing dual emitter transistor Q61 to become conductive and transistor Q60 to become non-conductive. A binary 1 is thus stored in transistor Q61, and a binary 0 is stored in transistor Q60.

To enable data to be written into the illustrated memory cell of memory cell matrix 10, and into the other memory cells of the left-hand most column in memory cell matrix 10, the write select command signal $\overline{XW0}$ must go high (i.e., towards zero volts) to allow the flip-flop comprising transistor Q60 and Q61 to change state, depending upon the status of data signals B0 and $\overline{B0}$. Ordinarily write select command signal $\overline{XW0}$ is at a negative potential to keep that transistor Q60 or Q61 in which a binary 1 was written in the previous write operation in a conductive mode, regardless of the transitory states of signals B0 and $\overline{B0}$.

Two independent read operations may be performed on each word stored in memory matrix 10. Read select command signals $\overline{XRA0}$ and $\overline{XRB0}$ determine whether a read operation is to occur and designate the particular set of data output buffers ZA0–ZA4 or ZB0–ZB4 at which the data from the desired word is to appear. If the word stored in the left-hand most column of memory matrix 10 is selected for read out, for example, on data output buffers ZA0–ZA4, read select command signal $\overline{XRA0}$ goes to 0, as will be seen from the read select logic equations below. With read select command signal $\overline{XRA0}$ a logical 0, a 0V signal is applied to the base of transistor Q63, turning it on, and allowing current to flow from current source CS over line 703, across the emitter-to-collector junction of transistor Q62, which is turned on by the 0V signal applied to its base over line 713 (assuming transistor Q60 is non-conductive and storing a binary 0 and that transistor Q61 is conductive and storing a binary 1), and from there over line 705 through emitter follower 200 to data output buffer 205 and output terminal ZA0. At the same time line 712 is at a negative potential since transistor Q61 is conducting. Therefore transistor Q64 is non-conductive and a zero-valued signal $\overline{RA0}$ representing a binary 0 is output through emitter follower 201 to output buffer 205.

Should it be desired to simultaneously read data from the word stored in the left-hand most column in memory matrix 10 and apply such data to output buffers ZB0–ZB4, read select command signal $\overline{XRB0}$ is set to a binary 0, and a binary 1 is read out over line 707 as signal RB0 in a similar manner as for signal RA0. Likewise a binary 0 is read out over line 708 in the form of output signal $\overline{RB0}$. Signal RB0 is applied through emitter follower 202 to data out buffer 210 and output terminal ZB0, and signal $\overline{RB0}$ is applied through emitter follower 203 to data output buffer 210.

The signal levels of the various intermediate signals identified in FIGS. 1A and 1B can best be discussed in terms of the logic equations appearing below.

The output QM¢$ of the master clock enable gate 141 is defined as follows:

QM¢$ = $.QM¢$ + $\overline{\$}$(¢$+NFTR+NFTS)

The output DSi of the data selector gates 21, 31, etc. is defined as follows:

DS$i$ = D$i$$\overline{NFTR.NFTS}$ + $\overline{QS\overline{k,i-1}}$.XW$h$.NFTS where $i$ = 0,1,2,3,4 (data bit #) and
$h$ = 0,1,2,3 (data word #)

The output QM$i$ of the master data gates 23, 33, etc. is defined as follows:

QM$i$ = $.QM¢$.QM$i$ + ($\overline{\$.QM¢\$}$).DS$i$

The output QSh,$i$ of the individual memory cells (see FIG. 14) is defined as follows:

QSh,$i$ = ($\overline{\$.QM¢\$}$).QSh,$i$ + $.QM¢$.XWh.QM$i$

The A read select signals XRAf are defined as follows:

| XRAf | | | |
|---|---|---|---|
| | XRA0 | = | $\overline{RAZ.RA1}$ |
| | XRA1 | = | RAZ.$\overline{RA1}$ |
| | XRA2 | = | $\overline{RAZ}$.RA1 |
| | XRA3 | = | RAZ.RA1 | where $f$ = 0,1,2,3 (read A address word #)

The read output of the A portion of any memory cell is given by the following logic equation:

$Rai = QSf,i.XRAf$

The output ZA$i$ of the A data buffers 205, 305, ..., 605 is defined as follows:

$ZAi = RAi$

The B read select signals XRB$h$ are defined as follows:

$$XRBg \begin{cases} XRB0 = \overline{RBZ.RB1} \\ XRB1 = RBZ.\overline{RB1} \\ XRB2 = \overline{RBZ}.RB1 \\ XRB3 = RBZ.RB1 \end{cases}$$

where $g = 0,1,2,3$ (read B address word #)

The read output of the B portion of any memory cell is defined as follows:

$RBi = QSg,i.XRBg$

The ouput ZB$i$ of the B data output buffers 210, 310, ..., 610 are defined as follows:

$ZBi = RBi$

The output DSW$j$ of the write selector gates 102, etc. are defined by the following logic equation:

$DSWj = (Wj.\overline{NFTR.NFTS}) + (NFTj.(NFTR+NFTS))$ where $j = 1,2$

The output OMW$j$ of the master write gates 105, etc. is given by the following logic equation:

$QMWj = \$.QM¢\$.QMWj + (\overline{\$.QM¢\$}).DSWj$

The write select commands XW$h$ are defined by the following logic equations:

$$XWh \begin{cases} XW0 = \overline{QMW2.QMW1} \\ XW1 = QMW2.\overline{QMW1} \\ XW2 = \overline{QMW2}.QMW1 \\ XW3 = QMW2.QMW1 \end{cases}$$

where $h = 0,1,2,3$ (write address word #)

Finally, the NFT input and output are defined by the following logic equations:

$\overline{NFTIN} = QSh,-1$ (from highest order bit of corresponding next lowest order word in next lowest memory register device)

$\overline{NFTOUT} = \overline{QSh,4}$

Word $h$ is selected for a write operation according to the following state table:

| W1 | W2 | Word (h) selected for write (assume $\overline{NFTR.NFTS}$) |
|---|---|---|
| 0 | 0 | h=0 |
| 1 | 0 | h=1 |
| 0 | 1 | h=2 |
| 1 | 1 | h=3 |

Word $h$ is selected for an NFT reset or shift operation in accordance with the following state table:

| NFT1 | NFT2 | Word (h) selected for NFT reset or shift (assume NFTR+NFTS) |
|---|---|---|
| 0 | 0 | h=0 |
| 1 | 0 | h=1 |
| 0 | 1 | h=2 |
| 1 | 1 | h=3 |

Word $f$ is selected for a read operation with outputs to be transmitted to output terminals ZA$i$ in accordance with the following state table:

| RA1 | RA2 | Word (f) selected for read on ZA$i$ |
|---|---|---|
| 0 | 0 | f=0 |
| 1 | 0 | f=1 |
| 0 | 1 | f=2 |
| 1 | 1 | f=3 |

Word $g$ is selected for a read operation with outputs to be transmitted to output terminals ZB$i$ in accordance with the following state table:

| RB1 | RB2 | Word (g) selected for read on ZB$i$ |
|---|---|---|
| 0 | 0 | g=0 |
| 1 | 0 | g=1 |
| 0 | 1 | g=2 |
| 1 | 1 | g=3 |

The next state of the true and complement outputs QS$h,i'$ and $\overline{QSh,i'}$ of any particular memory cell designated by location $h,i$ are defined in terms of the clock $, clock enable ¢$\overline{\$}$, non-functional test reset NFTR, non-functional test set NFTS, present outputs QS$h,i$ and $\overline{QSh,i}$, and data-in D$i$ and $\overline{Di}$ by means of the following state table:

| $ | ¢$\overline{\$}$ | NFTR | NFTS | (Next State) QSh,i' | $\overline{QSh,i'}$ |
|---|---|---|---|---|---|
| 1 | 1 | 0 | 0 | QSh,i | $\overline{QSh,i}$ |
| 1 | 0 | 0 | 0 | Di | $\overline{Di}$ |
| 1 | X | 1 | 0 | 0 | 1 |
| 1 | X | X | 1 | $\overline{QSh,i-1}$ | QSh,i−1 |

Note: The "Don't Care" condition is represented by "X".

From an analysis of the preceding logic equations and state tables, it will be seen that the clock $ is enabled by the clock enable ¢$\overline{\$}$ input or the NFTR or NFTS inputs. If the clock enable signal ¢$\overline{\$}$ is a logic 0, and neither NFTR nor NFTS is enabled (i.e., a logical 1), the desired data in bits D$i$ are transferred to the word selected by W1 and W2 on the falling edge of the clock $ (i.e., when the clock signal changes from a logical 0 to a logical 1). Simultaneously with a write operation, one or two read operations may be performed. For example, the contents of the word selected by read select signals RA1 and RA2 may be transferred to output terminals ZA0-ZA4, and the contents of the word selected by the read select signals RB1 and RB2 may be transferred to output terminals ZB0-ZB4.

In the case where NFTR is enabled (i.e., a logic 1) and NFTS is not enabled, the particular word selected by the NFT write signals NFT1 and NFT2 is set to a logic 0 on the falling edge of the clock.

In the case where NFTS is enabled, the device is configured as a 5-bit shift register having inversion between each bit using the particular word selected by the NFT write select signals NFT1 and NFT2. Data is shifted one bit position for each falling edge of the clock. The input to the first bit is provided by $\overline{\text{NFTIN}}$, and the output from the last bit appears on $\overline{\text{NFTOUT}}$.

The non-functional testing configuration enables those memory cells associated with a particular word to be analyzed for proper operation. For example, if the $\overline{\text{NFTIN}}$ signal is a binary 1 and the NFTS signal is enabled, after $i=5$ clock pulses, the $\overline{\text{NFTOUT}}$ signal will be a binary 0, assuming proper operation of all internal memory cells within the selected word. The output at the $\overline{\text{NFTOUT}}$ terminal will be a series of binary ones and zeroes until the $i$th clock pulse, when the binary 0 appears. Should the $\overline{\text{NFTOUT}}$ output deviate from this pattern at any point, as for example after $n$ clock pulses, it can be assumed that the cause of the failure occurred in the memory cell $n$ cells distant from the $\overline{\text{NFTOUT}}$ output terminal.

In the NFT mode, the memory register functions as a RAM, wherein both the read and write address are supplied by the NFT write select signals NFT1 and NFT2. In this operational mode, the read and write operations are sequential rather than simultaneous.

With reference to the timing diagram of FIG. 15, the timing relationships between the clock $, the clock enable $\overline{c\$}$, the non-functional test reset NFTR, the write select signals W1, W2, the NFT write select signals NFT1, NFT2, and the data-in signals D$i$ are shown. As is seen, the various inputs must remain stable during the 0-to-1 transition of the clock $. The timing relationships shown in FIG. 15 apply to the normal operation of the memory register when $\overline{\text{NFTS}}=1$.

FIG. 16 illustrates the required timing constraints when the memory register is configured as an inverting shift register in the NFT mode NFTS=1. In this configuration, the memory cells associated with a particular word selected by the NFT write select signals NFT1 and NFT2 function as an inverting shift register. In this mode the device is operating as a true RAM device in which read and write operations occur in sequential fashion. The effect of this is that valid information will be present at the $\overline{\text{NFTOUT}}$ terminal only after the rising edge of the clock $, and only if the NFTS, NFT1, and NFT2 inputs are maintained in a stable condition. The NFTS signal is set to 1 at the beginning of the NFT shifting sequence and is held there until the end of the shifting sequence. The NFT write select signals NFT1 and NFT2 must be held in a stable condition for a number of clock pulses equal to that required to shift information into and out of the particular word selected for NFT operation.

It will be apparent to those skilled in the art that the disclosed current mode simultaneous dual-read/single-write memory device may be modified in numerous ways and may assume many embodiments other than that specifically set and described above.

Accordingly, it is intended by the appended claims to cover all modifications of the invention which fall within the true spirit and scope of the invention.

What is claimed is:

1. An improved current mode simultaneous dual-read/single-write memory device comprising:
    a plurality of $n$ data-in circuits, each data-in circuit comprising a data selector circuit and a master latch register, each of said master latch registers generating a true data-in signal and a complement data-in signal,
    a write select circuit responsive to a plurality of write select signals for generating one of $m$ write select commands over $m$ write select lines,
    first and second read select circuits, said first read select circuit being responsive to a plurality of first read select signals for generating one of $m$ first read select command signals, and said second read select circuit being responsive to a plurality of second read select signals for generating one of $m$ second read select command signals,
    a control circuit responsive to a clock signal $ and to a clock enable signal $\overline{c\$}$, said control circuit generating an output signal to each of said master latch registers and to said write select circuit,
    an $m \times n$ matrix of memory cells, where $m$ represents the number of words to be stored in said memory cells and $n$ represents the number of bits per word, each cell comprising first and second dual emitter bipolar transistors, the base of each transistor being connected to the collector of the other transistor, resistive means connecting the collector of each transistor to a voltage potential, one emitter of each transistor being connected to one of $m$ write select lines, the remaining emitter of said first transistor being connected to said complement data-in signal of one of said master latch registers, the remaining emitter of said second transistor being connected to the true data-in signal of said master latch register, a first memory cell read enable circuit, said first memory cell read enable circuit responsive to said first read select command signal and being capable of distinguishing between conduction or non-conduction in said first and second transistors, said first memory cell read enable circuit generating a first true readout signal and a first complement readout signal, a second memory cell read enable circuit responsive to said second read select command signal and being capable of distinguishing between conduction or non-conduction in said first and second transistors, said second memory cell read enable circuit generating a second true readout signal and a second complement readout signal,
    first and second sets of $n$ data output buffers, said first set of $n$ buffers being responsive to said first true and complement readout signals from said first memory cell read enable circuit and said second set of $n$ buffers being responsive to said second true and complement readout signals from said second memory cell read enable circuit.

2. The improved current mode simultaneous dual-read/single-write memory device recited in claim 1 wherein said control circuit is further responsive to a non-functional test set signal NFTS and to a non-functional test reset signal NFTR, and wherein each of said data selector circuits comprises:
    a two-input differential upper level gate, a single input differential upper level gate, and a differential lower level gate, said two-input differential upper level gate receiving as one input a respective one of said n bits of a data word to be written into said memory and receiving as the other input the inverse of said NFTR signal, the outputs of said two-input differential upper level gate being connected to the outputs of said single input differential upper level gate, said input to said single input differential upper level gate being responsive to an $\overline{\text{NFTIN}}$ signal, said differential lower level gate being responsive to said NFTS signal, the non-inverting output from said first differential lower level gate being connected to said single input differential upper level gate, and the inverting output of said differential lower level gate being connected to said two-input differential upper level gate.

3. The improved current mode simultaneous dual-read/single-write memory device recited in claim 2, wherein each of said master latch registers comprises a first differential upper level gate, a second differential upper level gate, and a differential lower gate, the input to said first differential upper level gate being responsive to the output from said single input differential upper level gate of said data selector circuit, the output of said first differential upper level gate being connected to the input of said second differential upper level gate, the output of said second differential upper level gate being connected to the input thereto, the non-inverting output of said differential lower level gate being connected to said first differential upper level gate, and the inverting output of said differential lower level gate being connected to said second differential upper level gate, and wherein each of said data-in circuits further comprises first and second NAND gates, one input to said first NAND gate being connected to the non-inverting output of said second differential upper level gate, and one input to said second NAND gate being responsive to the inverting output of said second differential upper level gate, the other input to each of said NAND gates being responsive to the output of said control circuit, first and second current switching means, said first current switching means being responsive to the output of said first NAND gate and to a current source for generating said complement data-in signal, and said second current switching means being responsive to the output of said second NAND gates and to a current source for generating said true data-in signal.

4. The improved current mode simultaneous dual-read/single-write memory device recited in claim 1 wherein each of said output buffers comprises a first and a second emitter follower connected to said true and complement readout signals, respectively, and wherein said memory device further comprises a single output differential buffer connected to the outputs of said first and second emitter followers.

* * * * *